United States Patent [19]
Barrett

[11] Patent Number: 6,081,429
[45] Date of Patent: *Jun. 27, 2000

[54] TEST INTERPOSER FOR USE WITH BALL GRID ARRAY PACKAGES ASSEMBLIES AND BALL GRID ARRAY PACKAGES INCLUDING SAME AND METHODS

[75] Inventor: Keith E. Barrett, Boise, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 09/234,242

[22] Filed: Jan. 20, 1999

[51] Int. Cl.⁷ ....................................................... H05K 1/11
[52] U.S. Cl. ........................... 361/767; 361/764; 361/820; 257/700; 257/737; 257/686; 439/66; 439/70; 324/754; 324/755; 324/758
[58] Field of Search ...................................... 361/767, 764, 361/761, 782, 813, 820; 257/723, 724, 700, 737, 787, 686; 439/66, 73, 68, 70; 324/754, 755, 758

[56] References Cited

U.S. PATENT DOCUMENTS

| | | | |
|---|---|---|---|
| 4,322,778 | 3/1982 | Barbour et al. | 361/794 |
| 4,750,092 | 6/1988 | Werther | 361/783 |
| 4,772,936 | 9/1988 | Reding et al. | 357/80 |
| 5,045,921 | 9/1991 | Lin et al. | 357/74 |
| 5,258,648 | 11/1993 | Lin | 257/778 |
| 5,313,366 | 5/1994 | Gaudenzi et al. | 361/760 |
| 5,515,241 | 5/1996 | Werther | 361/784 |
| 5,541,450 | 7/1996 | Jones et al. | 257/697 |
| 5,559,445 | 9/1996 | Eaddy et al. | 324/755 |
| 5,615,089 | 3/1997 | Yoneda et al. | 361/764 |
| 5,640,048 | 6/1997 | Selna | 257/738 |
| 5,672,980 | 9/1997 | Charlton et al. | 324/755 |
| 5,691,041 | 11/1997 | Frankeny et al. | 428/209 |
| 5,708,567 | 1/1998 | Shim et al. | 361/723 |
| 5,741,729 | 4/1998 | Selna | 438/125 |
| 5,754,396 | 5/1998 | Felcman et al. | 361/683 |
| 5,767,575 | 6/1998 | Lan et al. | 257/701 |
| 5,770,891 | 6/1998 | Frankeny et al. | 257/727 |
| 5,800,184 | 9/1998 | Logergolo et al. | 439/66 |
| 5,969,534 | 10/1999 | Hubner et al. | 324/757 |

*Primary Examiner*—Leo P. Picard
*Assistant Examiner*—David Foster
*Attorney, Agent, or Firm*—Trask Britt

[57] ABSTRACT

An interposer for evaluating an electrical characteristic of a ball grid array package or of a semiconductor die thereof. The interposer includes electrically conductive vias positioned correspondingly to bond pads of the semiconductor die and to the electrical contacts or terminals of a carrier substrate of the ball grid array package. Test pads, or contact pads, are disposed proximate an outer periphery of the interposer. Each of the test pads is in electrical communication, preferably by means of electrical traces, with a corresponding electrically conductive via of the interposer. In use, the interposer is aligned with and disposed between the semiconductor die and the carrier substrate such that the test pads of the interposer are at least partially located outside of a periphery of the semiconductor die. Thus, the test pads are exposed around the ball grid array semiconductor die and are, therefore, accessible to electrical testing equipment. Upon contacting a test pad of the interposer with a probe operatively associated with electrical testing equipment, an electrical characteristic of the ball grid array package or the semiconductor die thereof may be evaluated. The present invention also includes assemblies of any combination of a semiconductor die, a test interposer, and a carrier substrate. Accordingly, the invention also includes a ball grid array package comprising a ball grid array semiconductor die, a test interposer, and a carrier substrate. The invention also includes methods of designing the interposer, as well as assemblies and ball grid array packages including the interposer.

11 Claims, 5 Drawing Sheets

TEST INTERPOSER FOR USE WITH BALL GRID ARRAY PACKAGES ASSEMBLIES AND BALL GRID ARRAY PACKAGES INCLUDING SAME AND METHODS

BACKGROUND OF THE INVENTION

1. Field of the Invention

The present invention relates to ball grid array ("BGA") packages and methods of testing or otherwise evaluating BGA packages. In particular, the present invention relates to test interposers that may be disposed between a BGA semiconductor device and a carrier substrate with which the BGA semiconductor device is in electrical communication. The present invention also includes BGA packages that include the interposer sandwiched between a BGA semiconductor device and a carrier substrate. The present invention also relates to methods of testing or otherwise evaluating BGA packages by employing the interposer of the invention.

2. Background of the Related Art

Ball grid array ("BGA") packages typically include a semiconductor die that has bond pads disposed over an active surface thereof, rather than merely proximate a periphery thereof. Thus, the bond pads of BGA semiconductor dice may be disposed across the active surfaces of the BGA semiconductor dice at an increased density relative to the bond pads disposed on conventional semiconductor dice with peripherally located bond pads. Therefore, BGA semiconductor dice may have smaller dimensions or an increased number of bond pads relative to the dimensions or number of bond pads of conventional semiconductor dice.

BGA packages typically include a carrier substrate to which the BGA semiconductor dice are flip-chip bonded, TAB bonded, or otherwise invertedly secured. Thus, the footprint of the terminals of the BGA carrier substrate corresponds substantially to the footprint of bond pads on an inverted BGA semiconductor die. As the use of BGA packages eliminates conventionally employed wire bonds that typically extend past the periphery of a semiconductor die to establish an electrical connection between the semiconductor die and a carrier substrate, the circuit density of the carrier substrate may be increased.

In order to test or otherwise evaluate the characteristics of the electrical signals transmitted to and from BGA packages, some manufacturers have employed specially designed test substrates in place of the carrier substrate. These test substrates may include test pads that extend from the circuitry of the test substrate. The use of such test substrates is, however, somewhat undesirable in that the circuitry of the test substrate does not accurately represent the circuitry of a corresponding carrier substrate to be employed in production of the BGA package. For example, the test substrate and production carrier substrate may have different circuit patterns, different circuit lengths, and different circuit densities. Thus, the circuits of the test substrate could consume more "real estate" on the test substrate than the circuits of a production carrier substrate, the circuits of the test substrate may not be optimally electrically routed for production, or the electrical characteristics of the test substrate may otherwise differ substantially from the electrical characteristics of a corresponding production carrier substrate.

Another approach to testing BGA packages involves the use of an interposer with test posts extending upwardly from the periphery of the interposer around the BGA semiconductor die. As each of the upwardly extending test posts of such an interposer would have to be electrically optimized, the electrical characteristics of a BGA package including such an interposer would not accurately represent the electrical characteristics of a similar BGA package without the interposer. Moreover, these upwardly extending test posts may act as antennas and may, therefore, interfere with the electrical properties of the BGA package or of any proximate circuit traces or other electrical components. Test interposers that include such upwardly extending test posts are also undesirable from the standpoint that the test posts may increase the overall height of BGA packages including the interposer and may, therefore, decrease the usefulness of the test interposer in production-level BGA packages (i.e., BGA packages with this type of interposer may not be salable).

Accordingly, there is a need for an interposer that may be employed to test or evaluate the electrical characteristics of signals transmitted to and from a BGA semiconductor die, that may be incorporated into a salable BGA package, and that will not interfere substantially with the electrical characteristics of the BGA package or any proximate electrical componentry.

SUMMARY OF THE INVENTION

The BGA package test interposer of the present invention includes a substantially planar, electrically non-conductive structure with electrically conductive vias extending through a central region thereof; electrically conductive traces extending from each of the electrically conductive vias, continuously supported by the planar structure, toward a periphery, or peripheral region, of the substantially planar structure; and a test pad in electrical communication with each of the electrically conductive traces. Due to its small size, the interposer is also useful in chip-scale packages ("CSPs").

Each of the electrically conductive vias of the test interposer is preferably positioned upon the substantially planar structure to correspond to a bond pad of a BGA semiconductor die to be disposed adjacent a first surface of the substantially planar structure and to an electrical terminal of a carrier substrate to be disposed adjacent a second surface of the planar structure. Thus, in an assembly including a BGA semiconductor die, the test interposer, and a carrier substrate, the test interposer may be flip-chip bonded, tape-automated bonded ("TAB"), or otherwise electrically connected, as known in the art, between the BGA semiconductor die and the carrier substrate.

The test pads of the test interposer may be disposed upon either or both surfaces of the planar structure. As a BGA semiconductor die may include up to one hundred or more bond pads, the test pads may be disposed proximate the periphery (i.e., on the peripheral region) of the planar structure in a staggered arrangement or in more than one row. Of course, the number of test pads on the test interposer may differ from the number of bond pads on the BGA semiconductor die since it may be desirable to evaluate signals transmitted through selected ones of the bond pads rather than signals transmitted through all of the bond pads.

As the test interposer of the present invention includes test pads disposed proximate the periphery thereof that may be insulated from substantially interfering with or deteriorating electrical signals, the interposer may be assembled with and incorporated into a production-level BGA package. Due to its relatively small size, the test interposer of the present invention may also be assembled with a BGA semiconductor die and attached to a carrier substrate without substantially increasing the amount of "real estate" consumed on the carrier substrate relative to the surface area consumed by the BGA semiconductor die alone and without significantly interfering with signals transmitted through the BGA semiconductor die or through the carrier substrate. Moreover, carrier substrates with electrically optimized circuit patterns may be employed in BGA package assemblies that include only a BGA semiconductor die and the carrier substrate, as well as in BGA package assemblies according to the present invention that also include a test interposer.

The present invention also includes a method of designing a test interposer, including configuring the substantially planar structure, the electrically conductive vias, the electrically conductive traces, and the test pads. The substantially planar structure has an outer periphery, which is also referred to as a peripheral region of the substantially planar structure, that is located outside of an outer periphery of a BGA semiconductor die to be assembled therewith. Thus, a peripheral portion of the substantially planar structure remains exposed after alignment and assembly of the substantially planar structure with a compatible BGA semiconductor die. The electrically conductive vias are configured to correspond to bond pads of the BGA semiconductor die. Each of the electrically conductive traces is configured to extend from a corresponding electrically conductive via toward the outer periphery of the substantially planar structure. Each of the test pads is configured to electrically communicate with a corresponding electrically conductive trace. The test pads are also configured to be located proximate the periphery (i.e., on the peripheral region) of the substantially planar structure, preferably such that each of the test pads will be at least partially located on the exposed peripheral region of the substantially planar structure and will, therefore, remain exposed as the BGA semiconductor die is assembled with the test interposer.

Methods of testing BGA packages are also within the scope of the present invention. Upon selection of a BGA semiconductor die, a compatible carrier substrate (i.e., a carrier substrate with terminals that correspond to bond pads of the BGA semiconductor die), and a compatible test interposer, the BGA semiconductor die, test interposer, and carrier substrate may be assembled, preferably with the test interposer disposed between the BGA semiconductor die and the carrier substrate. As test pads of the interposer are in electrical communication with the bond pads of the BGA semiconductor die and are exposed outside of or beyond the periphery of the BGA semiconductor die, the test pads may be probed, as known in the art, to evaluate the characteristics of electrical signals transmitted to and from the BGA semiconductor die.

Other features and advantages of the present invention will become apparent to those in the art through a consideration of the ensuing description, the accompanying drawings, and the appended claims.

DETAILED DESCRIPTION OF THE INVENTION

Figure 1:
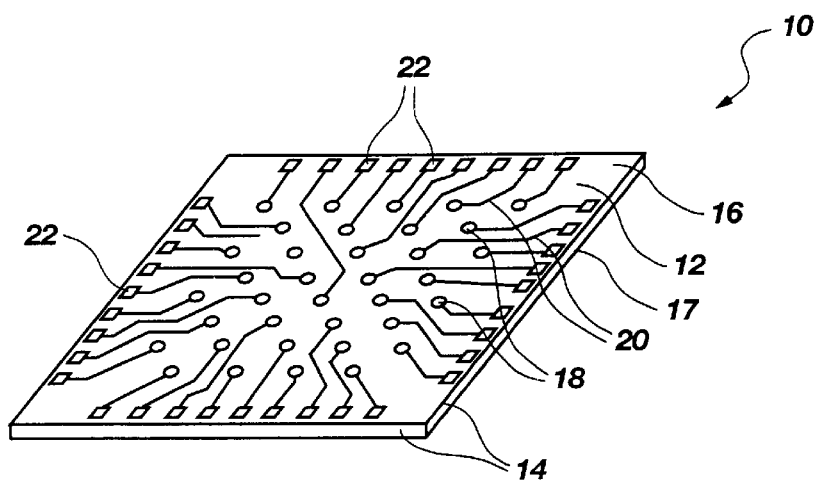
FIG. 1 is a perspective view of a BGA package test interposer according to the present invention.

FIG. 1 illustrates a test interposer 10, which is also referred to simply as an interposer, according to the present invention. As explained in greater detail below, test interposer 10 may be used to evaluate the electrical characteristics of a ball grid array (BGA) package, such as a chip-scale package ("CSP").

Test interposer 10 includes a substantially planar structure 12 having an outer periphery 14. Electrically conductive vias 18 are formed substantially through a central region of substantially planar structure 12. As illustrated, an electrically conductive trace 20 extends from selected ones of the electrically conductive vias 18 toward the outer periphery 14 (i.e., through a peripheral region of substantially planar structure 12) to a test pad 22, which is also referred to as an electrically conductive pad, disposed proximate outer periphery 14. Since it may be desirable to evaluate signals transmitted through only selected bond pads 32 of semiconductor die 30 (see FIGS. 2–3A), the number of test pads 22 may vary from the number of bond pads 32 of semiconductor die 30. If it is desirable to evaluate signals transmitted through each of the bond pads 32 of semiconductor die 30, the number of test pads 22 would be substantially the same as the number of bond pads 32 of semiconductor die 30. Of course, it may also be desirable to evaluate signals that originate from ancillary devices and that pass through either semiconductor die 30 or carrier substrate 40. Thus, some test pads 22 of interposer 10 may communicate with such ancillary devices and, thereby, facilitate the evaluation of signals from ancillary devices.

Substantially planar structure 12 is configured to have a sufficient surface area, relative to the surface area of a semiconductor die 30 (see FIGS. 2–3A) to be aligned and assembled therewith, to accommodate the desired number of test pads 22 proximate periphery 14 such that each of test pads 22 is at least partially exposed outside a outer periphery 31 (see FIGS. 2–3A) of semiconductor die 30. Substantially planar structure 12 is also configured to have a sufficient surface area to facilitate access by electrical evaluation equipment to test pads 22. Preferably, however, substantially planar structure 12 has a small enough surface area to facilitate disposal of structures on carrier substrate 40 in a desired density (i.e., test interposer 10 does not consume an undesirable amount of real estate on carrier substrate 40).

Figure 3:
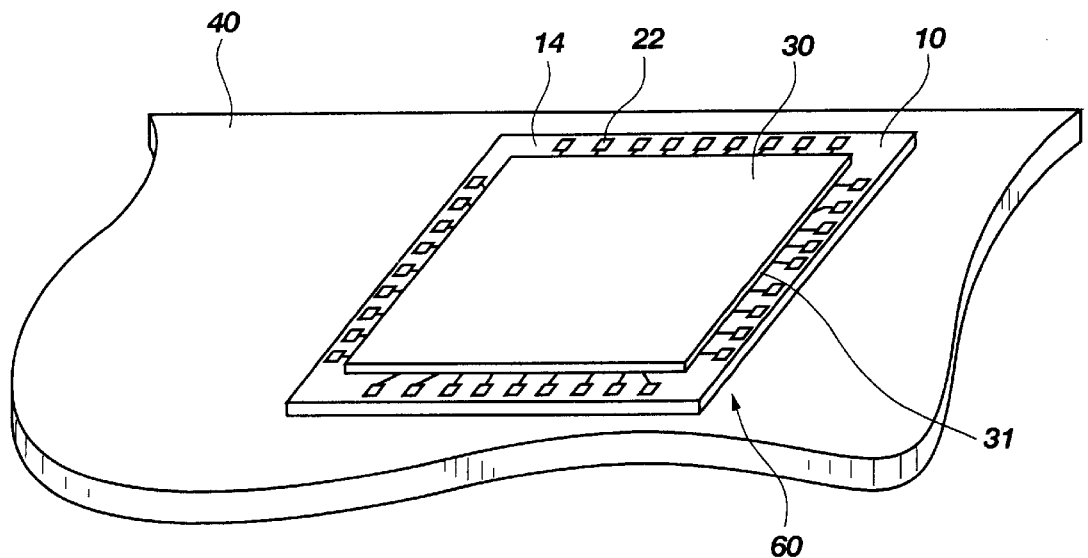
FIG. 3 is a perspective view of a BGA package including the test interposer of FIG. 1 disposed between a BGA semiconductor die and a carrier substrate.
Figure 3A:
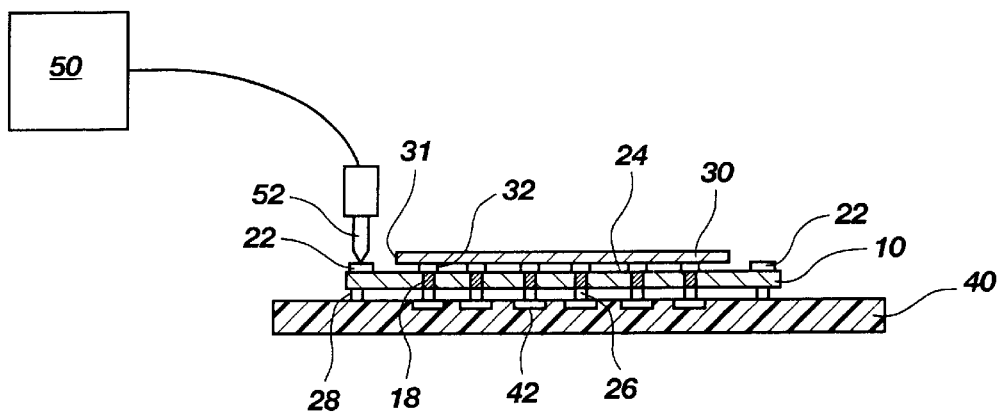
FIG. 3A schematically depicts use of the BGA package test interposer to determine the electrical characteristics of the BGA semiconductor die or of the BGA package.

Referring now to FIG. 3A, each electrically conductive via 18 is preferably positioned on substantially planar structure 12 in a location corresponding substantially to the location of a corresponding bond pad 32 of a ball grid array semiconductor die 30 to be assembled with test interposer 10. Preferably, each electrically conductive via 18 of test interposer 10 is also positioned on substantially planar structure 12 in a location substantially corresponding to the location of a corresponding terminal 42, which is also referred to as an electrical contact, on a carrier substrate 40 to be assembled with test interposer 10. Thus, upon assembly of semiconductor die 30, test interposer 10, and carrier substrate 40, bond pads 32 of semiconductor die 30 are substantially aligned and may communicate with each of their corresponding electrically conductive vias 18 and each of their corresponding terminals 42.

Figure 1A:
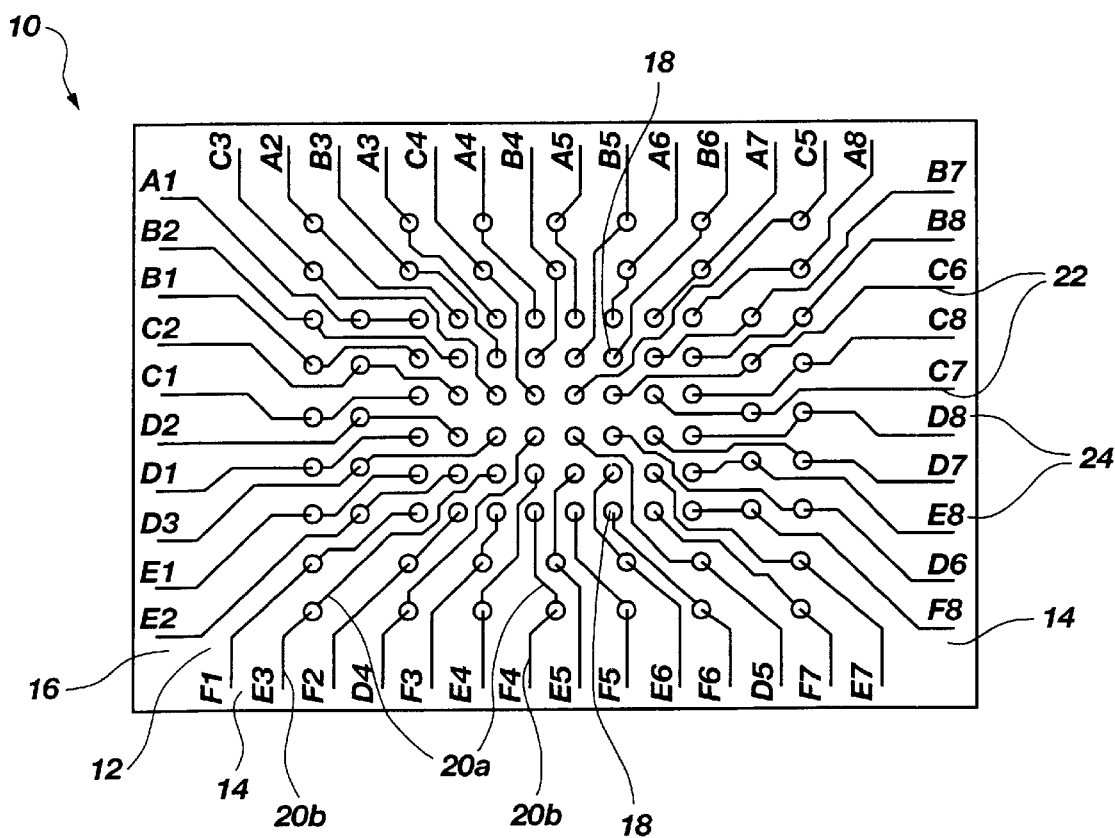
FIG. 1A is a schematic representation of a variation of the BGA package test interposer of FIG. 1.

Turning now to FIG. 1A, each electrically conductive trace 20 is continuously supported by substantially planar structure 12. Each electrically conductive trace 20 may include regions 20a that extend through an internal portion of substantially planar structure 12. Regions 20a are, therefore, not exposed to a surface 16, 17 of substantially planar structure 12. Electrically conductive traces 20 may also include other regions 20b that extend across and are exposed at a surface 16 or 17 of substantially planar structure 12.

Figure 4:
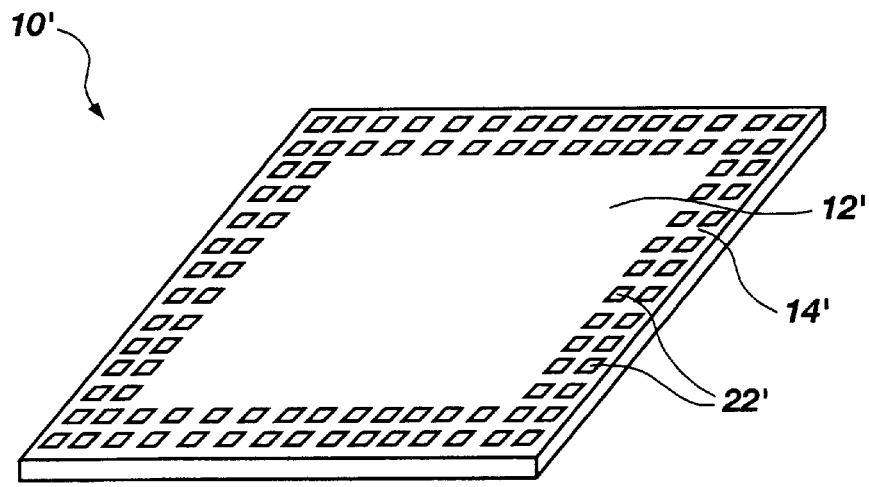
FIG. 4 is a perspective view of another embodiment of the BGA package test interposer, which includes more than one row of test pads disposed about the periphery thereof.
Figure 5:
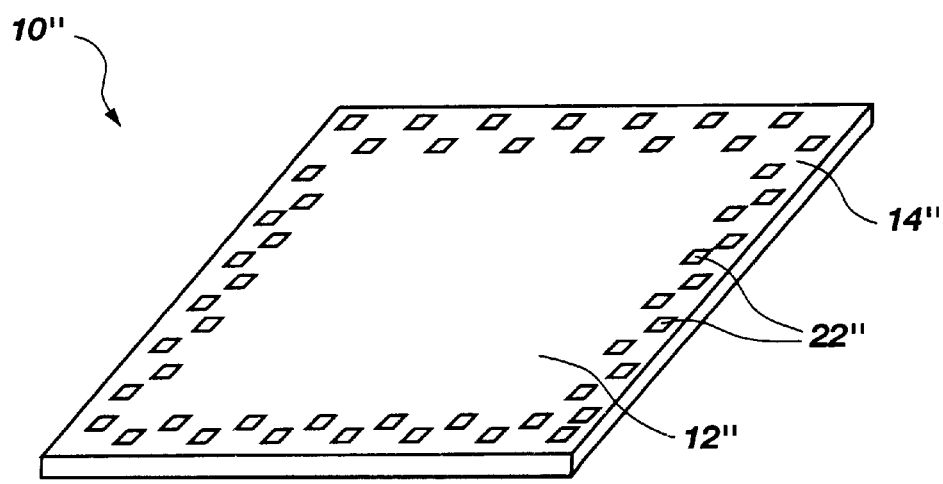
FIG. 5 is a perspective view of yet another embodiment of the BGA package test interposer, which includes test pads disposed about the periphery thereof in a staggered arrangement.

As depicted in FIG. 1, test pads 22 are disposed proximate outer periphery 14 of substantially planar structure 12 and, as described previously, are preferably exposed around periphery 31 of a semiconductor die 30 to be assembled with test interposer 10. As illustrated in FIG. 1, test pads 22 are disposed outer adjacent periphery 14 of substantially planar structure 12 in a single row. Alternatively, with reference to FIGS. 4 and 5, test pads 22', 22" may be disposed proximate outer periphery 14', 14" of substantially planar structure 12', 12" in more than one row or in a staggered arrangement, respectively.

Figure 6:
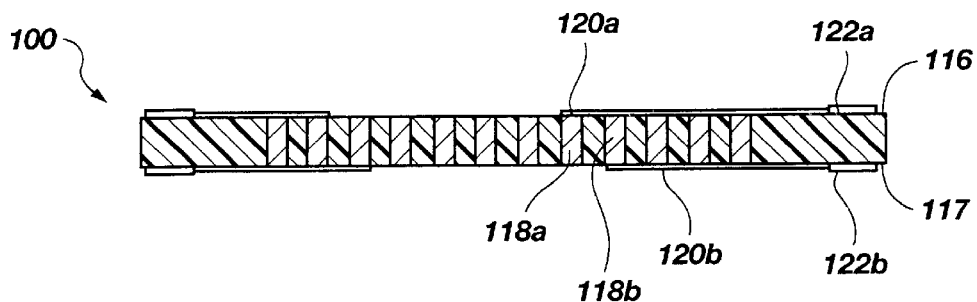
FIG. 6 is a cross-sectional view of another embodiment of the BGA package test interposer, which includes test pads exposed at each surface thereof.
Figure 7:
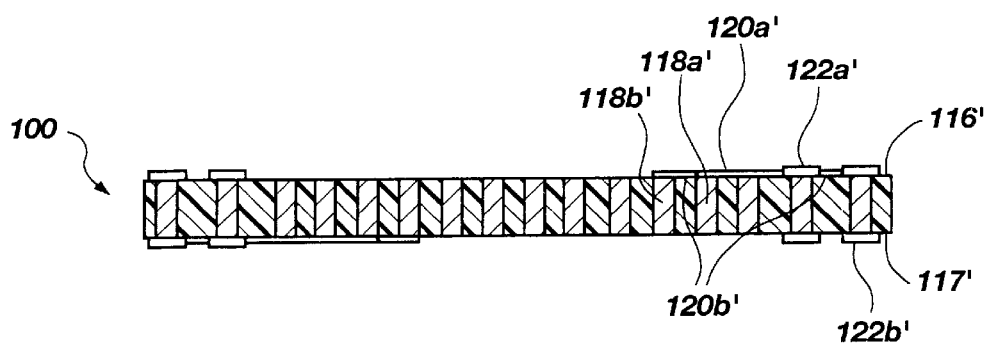
FIG. 7 is a cross-sectional view of another embodiment of the BGA package test interposer, which includes test pads that extend through the test interposer and are exposed at both surfaces thereof.

Referring now to FIGS. 6 and 7, each test pad 22 may be exposed at one or both surfaces 16, 17 of substantially planar structure 12. FIG. 6 illustrates an embodiment of test interposer 100 that includes test pads 122a and 122b that are each exposed at a single surface 116 and 117, respectively, of test interposer 100. As illustrated, test pad 122a communicates with electrically conductive via 118a by means of electrically conductive trace 120a and test pad 122b communicates with electrically conductive via 118b by means of electrically conductive trace 120b.

FIG. 7 illustrates another embodiment of the test interposer 100' that includes test pads 122a' and 122b' exposed at both surfaces 116', 117' of test interposer 100'. Test pads 122a', 122b' each communicate with a corresponding electrically conductive via 118a', 118b' by means of electrically conductive traces 120a', 120b', respectively. As test pads 122a' and 122b' are exposed at both surfaces 116', 117' of test interposer 100', test pads 122a' and 122b' may extend substantially through test interposer 100'. Alternatively, the electrically conductive traces 120a', 120b' that correspond to test pads 122a', 122b', respectively, may split and extend to substantially opposite surfaces 116', 117' of test interposer 100' to separate members of test pads 122a', 122b'.

Of course, test interposers that include a combination of test pads that are exposed at one surface thereof and test pads that are exposed at both surfaces thereof are also within the scope of the present invention.

The locations of each of electrically conductive vias 18, electrically conductive traces 20, and test pads 22 and the types of vias, traces, and test pads employed on test interposer 10 are configured for facilitating access to test pads 22.

Preferably, each of the test pads 22 of test interposer 10, its corresponding electrically conductive trace 20, and its corresponding electrically conductive via 18 are configured and located to have substantially no effect on electrical signals transmitted through a corresponding bond pad 32 of semiconductor die 30. Moreover, each of the test pads 22, its corresponding electrically conductive trace 20, its corresponding electrically conductive via 18, and test interposer 10 are preferably configured to have substantially no effect on electrical signals transmitted through other electrically conductive structures of semiconductor die 30, test interposer 10, or carrier substrate 40.

Referring again to FIG. 1A, indicia 24 may be located proximate outer periphery 14 of test interposer 10. As illustrated, indicia 24 correspond to and identify each test pad 22 as corresponding to one of the bond pads 32 of semiconductor die 30 (see FIG. 3A). Alternatively, indicia 24 on interposer 10 may identify the type of test interposer or indicate semiconductor dice with which the interposer is compatible. Indicia 24 may be formed by known processes, such as by screen printing or laser marking.

Interposer 10 may be fabricated by known substrate fabrication techniques. Accordingly, substantially planar structure 12 may be fabricated from FR-4, epoxy, BT/E, sycar, cyantate ester, or other suitable, low relative dielectric constant materials by known processes, such as lamination. Electrically conductive structures of interposer 10, such as electrically conductive vias 18, electrically conductive traces 20, and test pads 22 may be fabricated by known substrate metallization techniques and from known materials, such as aluminum, gold, or copper.

Figure 2:
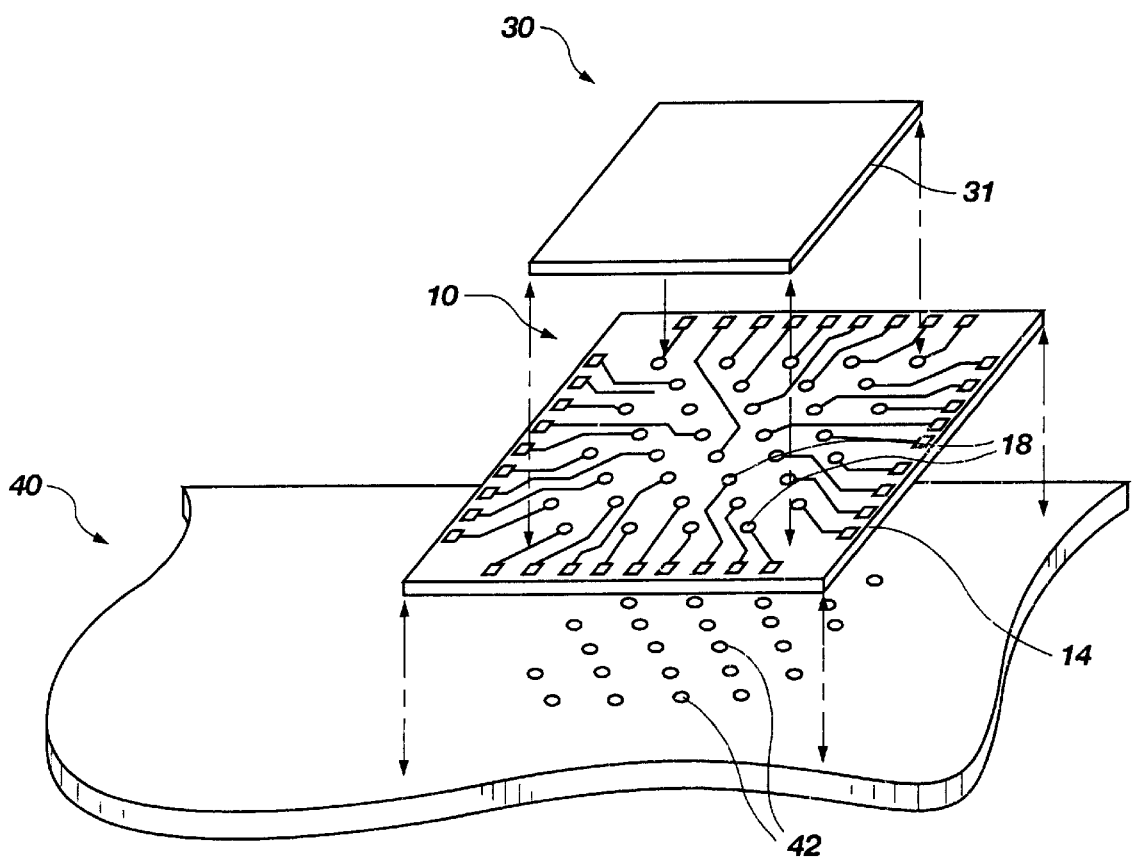
FIG. 2 is a perspective assembly view of a BGA package including an inverted BGA semiconductor die, the test interposer of FIG. 1, and a carrier substrate.

Referring now to FIGS. 2–3A, a method of assembling a ball grid array package 60 (FIGS. 3 and 3A) that includes test interposer 10 is also within the scope of the present invention. In assembling ball grid array package 60, a compatible ball grid array semiconductor die 30, test interposer 10, and carrier substrate 40 are disposed in a substantially mutually parallel relation to each other, and bond pads 32 (FIG. 3A) of semiconductor die 30, electrically conductive vias 18, and their corresponding terminals 42 of carrier substrate 40 are aligned, as known in the art. Preferably, electrically conductive vias 18 are conductively bonded to their corresponding bond pads 32 and corresponding terminals 42, as known in the art, such as by solder bonds, tape-automated bonding (TAB), z-axis polymer bonds, or other known electrically conductive bonding techniques to facilitate electrical communication between selected bond pads 32 and their corresponding terminals 42.

Accordingly, the present invention includes an assembly of test interposer 10 and carrier substrate 40, an assembly of semiconductor die 30 and test interposer 10, and an assembly of semiconductor die 30, test interposer 10, and carrier substrate 40. With reference to FIGS. 3 and 3A, a ball grid array package 60 that includes semiconductor die 30, test interposer 10, and carrier substrate 40 is also within the scope of the present invention.

Upon assembly of semiconductor die 30 and test interposer 10, each of the test pads 22 of test interposer 10 are preferably at least partially exposed beyond a periphery 31 of semiconductor die 30 (i.e., upon test interposer 10 between outer periphery 14 and periphery 31 ) so as to facilitate access to each test pad 22 by electrical testing equipment.

With continued reference to FIG. 3A, it is also preferable to provide access (e.g., by electrical testing equipment) to any of test pads 22 that are exposed at surface 17 of test interposer 10 and that, therefore, face carrier substrate 40 upon assembly of test interposer 10 and carrier substrate 40. Accordingly, test interposer 10 and carrier substrate 40 may be spaced apart from one another so as to facilitate the accessability of test pads 22 by electrical testing equipment. Test interposer 10 may be spaced apart from carrier substrate 40 by means of solder contacts 26 that conductively bond the electrically conductive vias 18 of test interposer 10 and their corresponding terminals 42 of carrier substrate 40.

Alternatively, or in combination with other spacing means for spacing test interposer 10 apart from carrier substrate 40, spacers 28 may be employed to space test interposer 10 apart from carrier substrate 40. Spacers 28 preferably extend from test interposer 10, and may extend a substantial distance between test interposer 10 and carrier substrate 40, or a lesser distance to provide a clearance between end of spacer 28 and the adjacent carrier substrate 40. Alternatively, spacers 28 may extend upwardly from carrier substrate 40. Spacers 28 may be fabricated from solder, polymer, glass, or other materials that will withstand the temperatures and other operating conditions of semiconductor die 30, as well as the conditions to which test interposer 10 is exposed during electrical evaluation of semiconductor die 30 or the ball grid array package including same. Spacers 28 may also provide support (e.g., radial stability) to test interposer 10 while semiconductor die 30 is operating, during evaluation of the electrical characteristics of semiconductor die 30 or of the ball grid array package, or during assembly of test interposer 10 and carrier substrate 40. Accordingly, the spacing and arrangement of spacers 28 depends, at least in part, upon the size and configuration of test interposer 10.

Figure 3B:
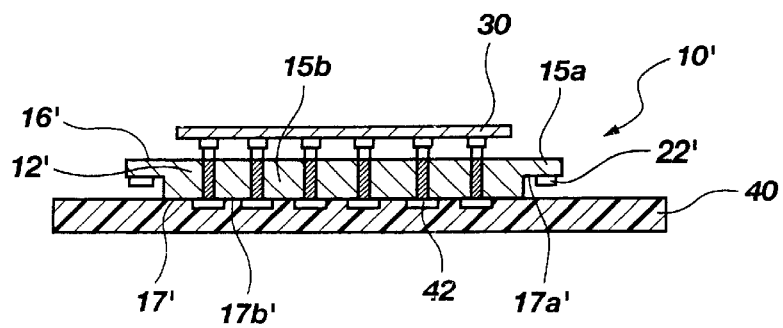
FIG. 3B is a side plan view of another embodiment of the test interposer, which includes test pads exposed to a peripheral ledge of a surface thereof.

Alternatively, with reference to FIG. 3B, substantially planar structure 12' may include a thinner peripheral region 15a than the central region 15b thereof. Peripheral region 15a may also be referred to herein as a peripheral ledge. As illustrated, surface 16' of substantially planar structure 12' is a substantially flat, planar surface. Accordingly, surface 17' includes a ledge 17a' at the periphery thereof and a relatively raised (when interposer 10 is inverted) center 17b'. Thus, any test pads 22' exposed to ledge 17a' of interposer 10' are distanced from the adjacent surface of carrier substrate 40, even if the center 17b' of surface 17' rests directly upon carrier substrate 40.

FIG. 3A illustrates an exemplary method of testing or evaluating the characteristics of signals transmitted through ball grid array package 60 in accordance with the present invention. As a desired amount of voltage (e.g., 3.3 V or 5 V) is supplied to the semiconductor die 30, the characteristics of the electrical signals transmitted to and from selected bond pads 32 of semiconductor die 30 may be evaluated at a corresponding test pad 22 of test interposer 10. For example, a test pad 22 may be electrically contacted by a probe 52 of an electrical evaluation apparatus 50 of a type known in the art.

Referring again to FIG. 7, in testing assemblies that include a test interposer 100' with test pads 122a', 122b' exposed to both surfaces thereof, increased electrical contact with such test pads may be achieved by contacting a probe to both of the exposed portions of these test pads. Test pads 122a', 122b' may also facilitate electrical evaluation by means of clip-on leads or probes. Of course, test pads 22 that are only exposed at one surface of test interposer 10 may also be contacted by clip-on leads or probes.

Due to the relatively small size of test interposer 10, and since the test interposer has substantially no effect on the properties of the electrical signals transmitted between semiconductor die 30 and carrier substrate 40, test interposer 10 may be included in salable, or production-level, ball grid array packages 60. Accordingly, the present invention also includes a method of quality control that includes evaluating the electrical characteristics of production-level ball grid array packages 60 that include test interposer 10.

Figure 8:
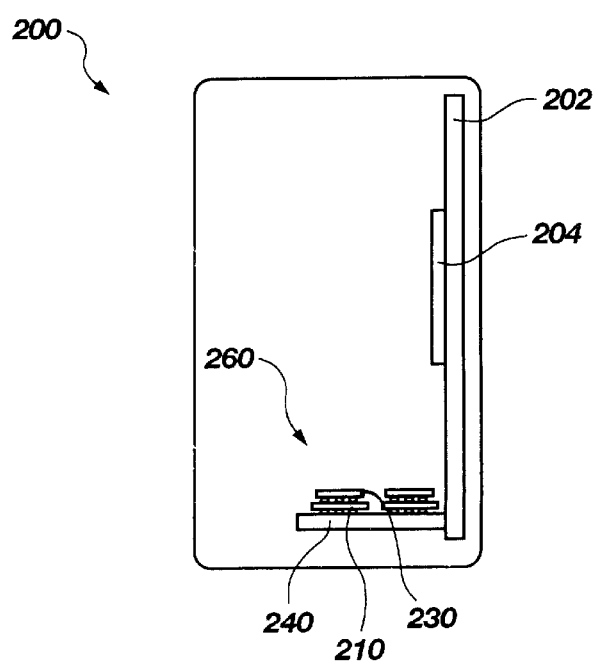
FIG. 8 is a schematic representation of a computer that includes a BGA package including the test interposer.

Turning now to FIG. 8, a computer 200 that includes a ball grid array package including the test interposer of the present invention is also within the scope of the present invention. As illustrated, computer 200 includes a motherboard 202 with an associated processor 204. A ball grid array package, 260, which includes a carrier substrate 240, interposers 210 operatively disposed adjacent thereto, and semiconductor dice 230 operatively disposed adjacent a corresponding interposer 210, is also associated with motherboard 202 and with the processor 204 thereon.

Although the foregoing description contains many specifics and examples, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein and which fall within the meaning of the claims are to be embraced within their scope.

What is claimed is:

1. A method of testing a semiconductor die of a ball grid array package, comprising:

selecting an electrically optimized carrier substrate including at least one terminal positioned correspondingly to at least one bond pad of the semiconductor die;

selecting a test interposer including
at least one electrically conductive via corresponding to said at least one bond pad and to said at least one terminal; and
at least one test pad disposed proximate a periphery of said test interposer and in electrical communication with said at least one electrically conductive via;

assembling the semiconductor die, said test interposer, and said carrier substrate so that said at least one bond pad, said at least one electrically conductive via, and said at least one terminal are in electrical communication; and probing said at least one test pad to determine an electrical characteristic of the semiconductor die when assembled with said carrier substrate.

2. The method of claim 1, wherein said assembling comprises disposing said test interposer between the semiconductor die and said carrier substrate.

3. The method of claim 1, wherein the semiconductor die includes a plurality of bond pads.

4. The method of claim 3, wherein said selecting said carrier substrate comprises selecting said carrier substrate to have a plurality of terminals that correspond to selected ones of said plurality of bond pads.

5. The method of claim 3, wherein said selecting said test interposer comprises selecting said test interposer to have a plurality of electrically conductive vias that correspond to selected ones of said plurality of bond pads.

6. The method of claim 1, wherein said probing comprises contacting a selected said at least one test pad exposed at a first surface of said test interposer.

7. The method of claim 1, wherein said probing comprises contacting a selected said at least one test pad exposed at a first surface and at a second surface of said test interposer.

8. The method of claim 3, wherein said probing comprises substantially simultaneously contacting selected ones of a plurality of test pads.

9. A method of evaluating an electrical characteristic of a ball grid array package including a semiconductor die and a carrier substrate without substantially altering or deteriorating signals to or from the semiconductor die, comprising:

disposing a test interposer between the semiconductor die and the carrier substrate such that selected bond pads of the semiconductor die are in electrical communication with corresponding terminals of the carrier substrate, said test interposer including test pads routed to a periphery of said test interposer and in electrical communication with said selected bond pads; and measuring an electrical signal to or from at least one of said selected bond pads at a corresponding one of said test pads.

10. The method of claim 9, wherein said measuring comprises contacting said corresponding one of said test pads with a test probe.

11. The method of claim 9, wherein said disposing said test interposer includes disposing a test interposer with each electrically conductive via thereof extending substantially vertically therethrough.

* * * * *